(12) United States Patent
Geels et al.

(10) Patent No.: US 6,181,721 B1
(45) Date of Patent: *Jan. 30, 2001

(54) VISIBLE WAVELENGTH, SEMICONDUCTOR OPTOELECTRONIC DEVICE WITH A HIGH POWER BROAD, SIGNIFICANTLY LATERALLY UNIFORM, DIFFRACTION LIMITED OUTPUT BEAM

(75) Inventors: Randall S. Geels, San Jose; Ross A. Parke, Fremont; David F. Welch, Menlo Park, all of CA (US)

(73) Assignee: SDL, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/650,704

(22) Filed: May 20, 1996

(51) Int. Cl.$^7$ ............................................. H01S 3/19
(52) U.S. Cl. ........................ 372/45; 372/46; 257/191
(58) Field of Search ........................ 372/45, 46; 437/95; 257/191

(56) References Cited

U.S. PATENT DOCUMENTS

| | | | |
|---|---|---|---|
| 4,712,219 | * 12/1987 | Yano et al. | 372/45 |
| 4,713,821 | 12/1987 | Bradford et al. | 372/44 |
| 4,744,089 | 5/1988 | Montroll et al. | 372/50 |
| 5,103,271 | * 4/1992 | Izumiya et al. | 372/45 |
| 5,124,995 | 6/1992 | Yokotsuka et al. | 372/45 |
| 5,144,633 | 9/1992 | Ohnaka et al. | 372/45 |
| 5,274,656 | 12/1993 | Yoshida | 372/45 |
| 5,392,308 | 2/1995 | Welch et al. | 372/92 |
| 5,400,353 | 3/1995 | Walpole et al. | 372/46 |
| 5,405,803 | * 4/1995 | Kusaka | 437/95 |
| 5,537,433 | * 7/1996 | Watanabe | 372/45 |
| 5,548,137 | * 8/1996 | Fan et al. | 257/191 |
| 5,610,413 | * 3/1997 | Fan et al. | 372/45 |

OTHER PUBLICATIONS

Henry Kressel et al, "Semiconductor Lasers and Heterojunction LEDs", Academic Press, Inc., pp. 61–70 (1977) no month available.

K. Kobayashi et al., "AlGaInP Double heterostructure Visible Light Laser Diodes with a GaInP Active Layer Grown by Metalorganic Vapor Phase Epitaxy", *IEEE Journal of Quantum Electronics,* vol. QE–23(6), PP. 704–711, Jun. 1987.

Sales Brochure for "SDL 7350–X6 —Preliminary Product—500mW Visible 670–680 nm Diffraction Limited Laser Diode", DCC 059 EB 0659, SDL, Inc., San Jose, CA (Jun., 1995).

* cited by examiner

*Primary Examiner*—James W. Davie
(74) *Attorney, Agent, or Firm*—W. Douglas Carothers, Jr.

(57) ABSTRACT

A Group III-V semiconductor optoelectronic device provides for visible wavelength light output having a more laterally uniform, high power beam profile, albeit still quasi-Gaussian. A number of factors contribute to the enhanced profile including an improvement in reducing band offset of the Group III-V deposited layers improving carrier density through a decrease in the voltage drop require to generate carrier flow; reduction of contaminants in the growth of Group III-V AlGaInP-containing layers with compositional Al, providing for quality material necessary to achieve operation at the desired visible wavelengths; the formation of an optical resonator cavity that provides, in part, weak waveguiding of the propagating light; and the utilization of a mechanism to provide for beam spreading and filing in a beam diverging gain section prior to actively aggressive gain pumping of the propagating light in the device.

10 Claims, 6 Drawing Sheets

VISIBLE WAVELENGTH, SEMICONDUCTOR OPTOELECTRONIC DEVICE WITH A HIGH POWER BROAD, SIGNIFICANTLY LATERALLY UNIFORM, DIFFRACTION LIMITED OUTPUT BEAM

FIELD OF THE INVENTION

This invention relates generally to visible wavelength, semiconductor optoelectronic devices for producing high power diverging beam output and, more particularly, to visible laser devices generating light within the 600 nm to 700 nm wavelength range that provide a broad, high power output beam.

BACKGROUND OF THE INVENTION

Since about 1987, in particular, there has been much published about semiconductor lasers that are capable of emitting light within the 600 nm to 700 nm wavelength range for use in many applications, such as optical disc apparatus, laser printers, bar code readers and the like. An example of an earlier article on this subject is the paper of K. Kobayashi et al. entitled, "AlGaInP Double heterostructure Visible Light Laser Diodes with a GaInP Active Layer Grown By Metalorganic Vapor Phase Epitaxy", *IEEE Journal of Quantum Electronics*, Vol. QE23(6), pp. 704–711, June 1987. These devices include ternary and quaternary Group III-V materials including In, P or InP for achieving visible lightwave generation. The devices have an active region of GaInP or AlGaInP lattice matched or coherently strained to a GaAs substrate with cladding layers of AlGaInP and confinement layers of AlInP. The active region may be a single quantum well of GaInP or multiple quantum well structure of GaInP well layers and AlGaInP barrier layers or alternating layers of AlGaInP of different compositional ratio. A more recent publication is U.S. Pat. No. 5,144,633 to Ohnaka et al. which discloses a visible wavelength, semiconductor laser device having an active region of GaInP lattice matched to a GaAs substrate, with cladding layers of AlGaInP and at least one confinement layer of AlInP. A stopper layer of GaInP (doped or undoped) is usually formed within the AlInP confinement layer for aiding in an etching operation to form a buried or inner loss-guide stripe region through a subsequently formed current blocking layer of GaAs.

A problem in these devices is the confinement of carriers to the active region and provision for a low resistance path for carrier supply to the active region. This problem is addressed, in part, in U.S. Pat. No. 5,274,656 to Yoshida. In this patent, reference is made to the fact that higher Al composition ratios in the cladding layers are preferable for efficient confinement of carriers to the active region. However, it happens that such higher Al composition ratios bring about more heat generation affecting the long term reliability of these devices. Attempts to decrease the resistivity of the cladding layers through decrease of the layer resistivity through increase the doping level of the layer is not effectual for AlGaInP layers, for example, because the doping activation ratio level is reduced as Al content increases. In order to achieve shorter wavelengths into the visible spectrum, the bandgap of the active layer can be increased, but the difference in bandgap between the active region and the cladding region becomes closer, decreasing the carrier confinement to the active region. Yoshida provides an upper cladding layer comprising AlGaInP that decreases in Al composition ratio from its inner most limit closest to the GaInP active region to its outer most limit. The overall Al composition ratio is lowered so that carrier density in at least the outer reaches of the cladding layer is increased without need of increasing the layer doping level. However, further reductions in forward voltage drop are desired in cladding layer areas of these devices, particularly in the case where narrow pumping stripes are employed with broad area beam output with higher output power.

Thus, the problem still persists on how to further reduce the voltage drop in these cladding layers to provide a low resistance path to the active region without sacrificing high carrier confinement to the active region. This is particularly important in visible wavelength, semiconductor devices that are designed to provide a high level of power, such as employing on the same semiconductor chip or on a different semiconductor chip, a single mode section and a gain section for achieving high power. One such device comprises a master oscillator in combination with a beam enlarging or diverging gain section providing a beam diverging phase front forming a stable oscillator. Another such device comprises a single mode section and a diverging gain section utilizing a beam diverging phase front forming an unstable oscillator. Such devices are disclosed in the U.S. Pat. Nos. 5,392,308; 5,539,571; and 5,537,432, which patents are assigned to the assignee herein and are incorporated herein by their reference. These devices demand higher carrier concentration and carrier supply to a comparatively narrow stripe region (e.g., in the range of about 3 μm to about 5 μm wide) compared to the broad diverging gain pumping region and requiring good carrier conversion efficiency in the single mode section through enhanced carrier supply. One manner of accomplishing good carrier conversion efficiency is to provide a wider pumping stripe for the single mode section, but a wider pumping stripe means a larger aperture into the diverging gain region which can result in poor beam formation and divergence.

What is needed for these combination single mode and beam enlarging gain resonator devices is to enhance the carrier density through a decrease in the layer voltage drop to improve the conversion efficiency of carriers in the single mode section while providing good beam divergence into the beam diverging gain section providing an improved flattening and broadening of the Gaussian beam profile.

It is, therefore, a primary object of this invention to provide a visible wavelength, semiconductor optoelectronic device with high CW power, diffraction limited, visible beam.

It is another object of this invention to provide good beam divergence with improved flattening and broadening of the Gaussian beam profile with enhancement to beam edges by permitting the beam to initially expand before more full and aggressive pumping is applied in wider regions of the beam diverging gain section with accompanying high carrier conversion efficiency in a stable or unstable resonator light emitting devices having a single mode section and a beam diverging gain section.

It is a further object of this invention to improve the quality of growth of sensitive Group III-V, AlGaInP-containing materials employed in the active region and confining and cladding layers of visible wavelength, semiconductor optoelectronic devices.

It is a still further object of this invention to improve the formation and utility of high resistance regions in forming beam diverging gain sections employed in high power, visible wavelength, semiconductor optoelectronic devices.

SUMMARY OF THE INVENTION

According to this invention, a visible wavelength, semiconductor optoelectronic device with high CW power and diffraction limited, visible beam includes the use of Group III-V, AlGaInP-containing materials to achieve generation of visible wavelengths of light, such as within the range of 600 nm to 700 nm by reducing the band offset between these materials and GaAs to improve the carrier density by means of a reduction in layer voltage required to generate carrier flow while improving the quality of growth of AlGaInP-containing materials, particularly where these materials include compositional Al. In the preferred embodiment, an AlGaAs layer or a combination AlGaAs and AlGaInP layer is grown between GaAs and AlGaInP-containing confinement and cladding layers, which may be index graded, at least in part, to provide an overall reduction in the band offset between GaAs and these materials reducing impediment of carrier flow while permitting maintenance of good carrier confinement in the active region. High temperature growth of the AlGaAs layer on a GaAs substrate also provides a gettering function in the MOCVD reactor by removal of contaminants in the reactor that degrade the quality of the growth of AlGaInP-containing materials, particularly those that contain compositional Al used to achieve desired visible wavelength outputs.

Another aspect of this invention is the provision for an improved unstable resonator optoelectronic device having a single spatial mode section functioning as a single mode spatial filter and a diverging gain section for enhancing the power output of the beam from the device. The single spatial mode section includes a three-tier current blocking region to form the single mode spatial filter and a high current density pumping region with loss-guiding of the propagating light in the device, and a diverging gain section that includes a light diverging region defined by adjacent high resistance regions formed into the Group III-V semiconductor structure providing for both a high gain light diverging region as well as a small refractive index change for minimal guiding of the propagating light in the device. Also, the region of the diverging gain section adjacent to the single mode section, that initially receives the propagating light from the single mode section, is patterned to only provide limited pumping to this region to permit the propagating light to initially spread and fill the diverging limits of the diverging gain section prior to aggressive gain pumping of the light. This improves the saturation of the beam edges of evanescent beam tails to provide a more uniform lateral beam profile, even though the beam retains some quasi-Gaussian appearance. The resulting unstable resonator formed between end facet reflectors of the device incorporating these attributes provides for both reduce voltage drop and lightwave guiding so that a more uniform beam profile with higher power can be obtained.

FIG. 1A is plan view of another embodiment of the visible wavelength, semiconductor optoelectronic device shown in FIG. 1.

The single mode section and the diverging gain section of the optoelectronic device may be on the same chip or may be on separate chips that are optically coupled to achieve the advantages of this invention.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS OF THE INVENTION

Figure 1:
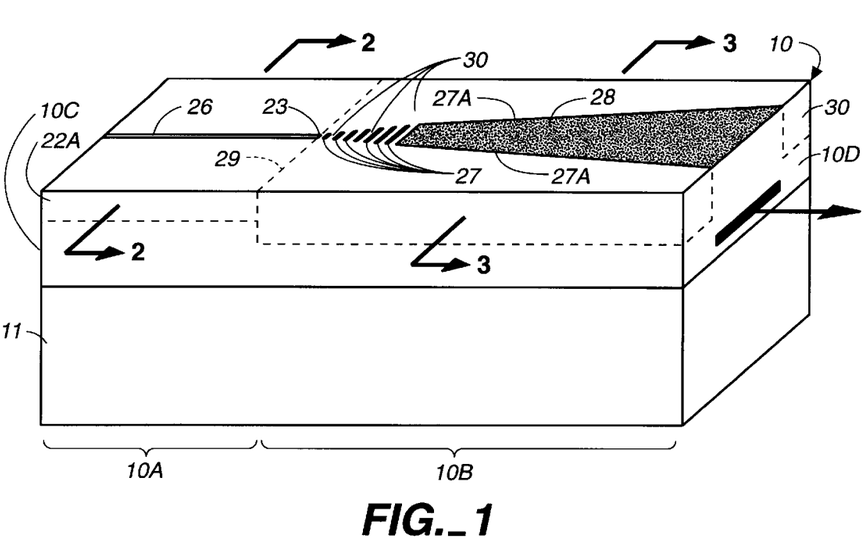
FIG. 1 is a perspective view of the visible wavelength, semiconductor optoelectronic device with high beam power according to this invention.
Figure 1A:
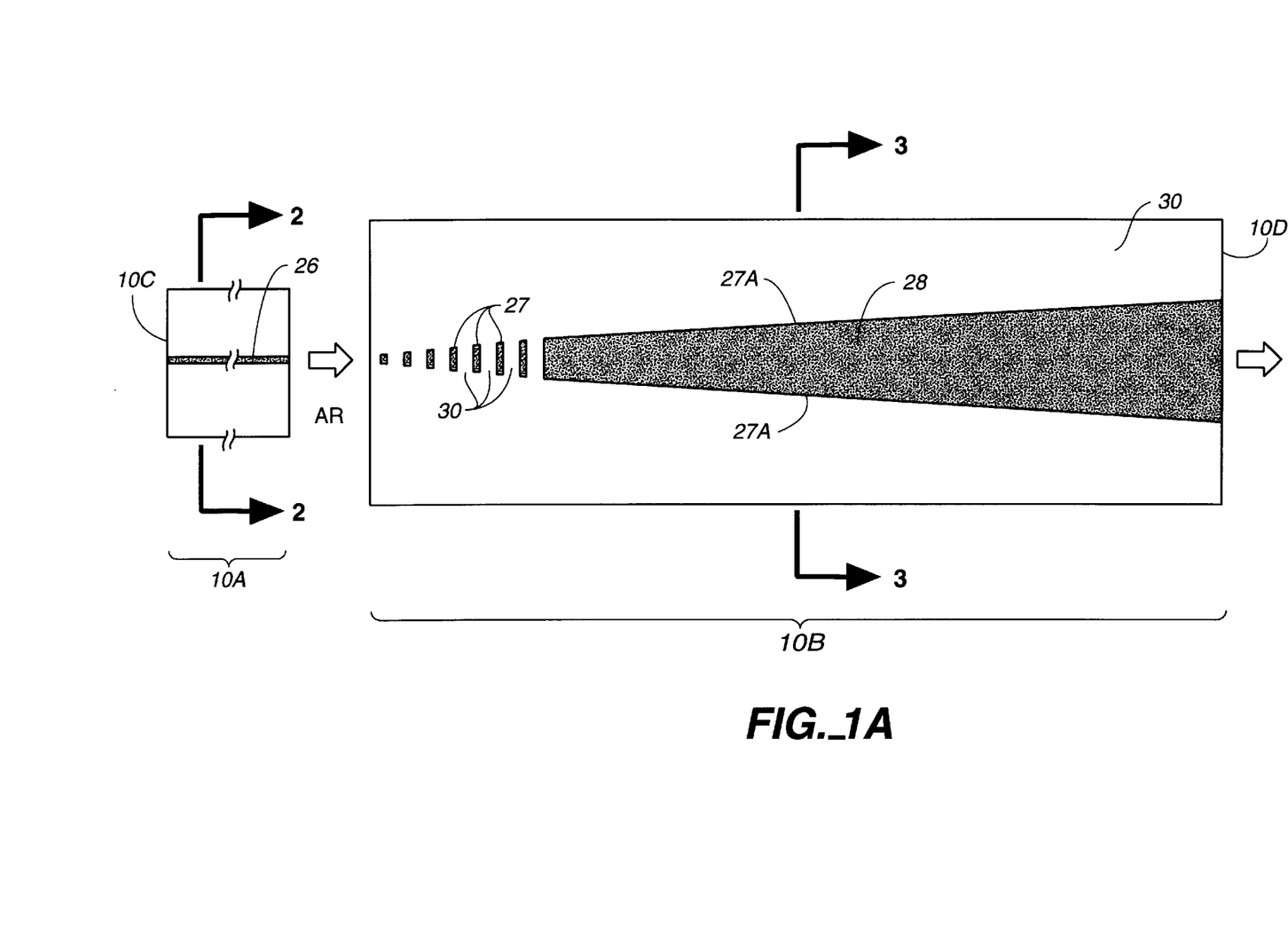
Figure 2:
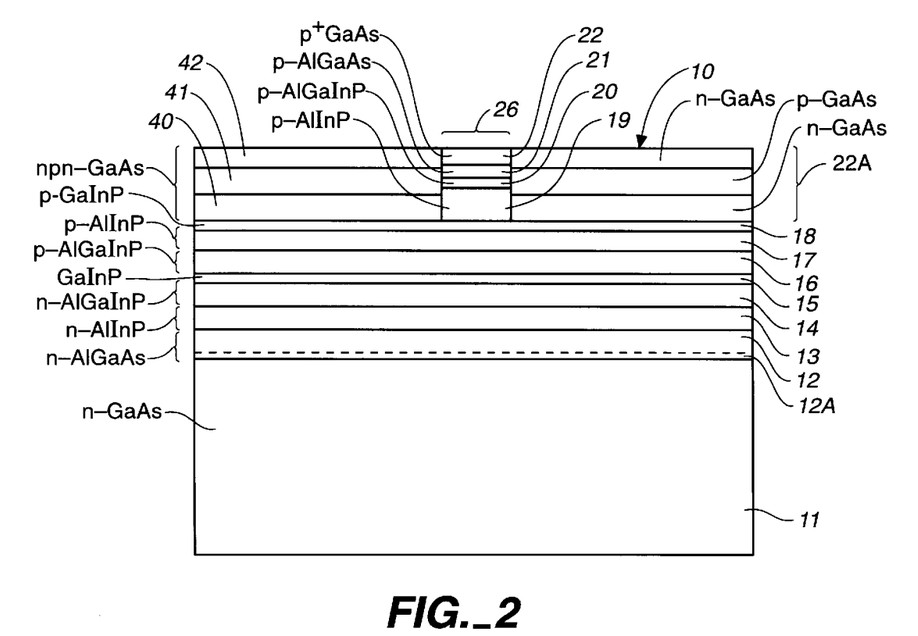
FIG. 2 is a cross-sectional view of the device of FIG. 1 taken along the line 2—2 of FIG. 1.
Figure 3:
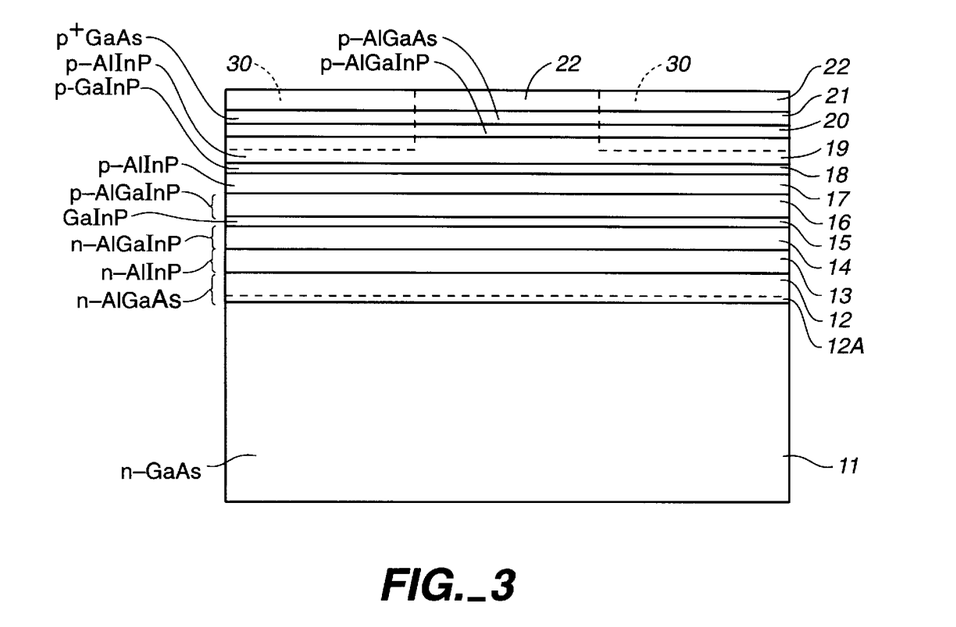
FIG. 3 is a cross-sectional view of the device of FIG. 1 taken along the line 3—3 of FIG. 1.

Reference is now made to FIGS. 1 to 3 for detail explanation of the visible wavelength, semiconductor optoelectronic device 10 with high beam power output according to this invention. Device 10 comprises to two principal sections, a single mode section 10A having pumping stripe 26 and a beam enlarging or diverging gain section 10B having a pattern of pumping stripes 27 of monotonic increasing lateral length and trapezoidal shaped pumping stripe 28. Section 10A may include optical feedback means, such as DFB or DBR means in the active region, as is known in the art, so that it will operate as an oscillator and, in conjunction with beam diverging gain section 10B, will function as a stable resonator. However, the feedback means for device 10 may be end facets 10C and 10D or internal reflectors integrated into the device adjacent the ends of its optical cavity of device 10 reflecting a portion of the light back into the optical cavity, providing a light emitting device functioning as an unstable resonator. Also, as is clear from the previously incorporated patents, single mode section 10A need not be on the same chip as beam diverging gain section 10B. Rather, section 10A can be a separate chip with its output aligned within an optical cavity that includes a chip having diverging gain section 10B, as illustrated in FIG. 1A. The two separate chips can operate within a formed optical cavity as either a stable or unstable resonator. Single mode section 10A can be modelocked operated in either type of these two configurations and function as a stable or unstable resonator. Moreover, tuning of the wavelength of device 10 can be accomplished by means of wavelength tuning means as taught in the U.S. Pat. No. 5,392,308, incorporated herein.

As best shown in FIGS. 2 and 3, device 10 comprises a Group III-V, AlGaInP structure preferably grown by employing conventional MOCVD. First, a n-GaAs buffer layer is typically grown. Then, a n-AlGaAs transitional layer 12 is grown on a n-GaAs substrate 11. Layer 12 may be composed of two portions, portion 12A having an index graded content, where the Al compositional ratio is monotonically changed, and another much thicker layer portion 12B of the same Al compositional ratio. Next, a n-AlInP lower cladding layer 13 is deposited on layer 12, followed by a n-AlGaInP lower confinement layer with a lower bandgap than layer 13, for purposes of carrier confinement as is well known in the art. Next, an undoped active region 15 is formed comprising a quantum well layer of GaInP having the lowest bandgap of the light generation and waveguide structure. Alternatively, active region 15 may comprise an InGaAsP quantum well region with adjacent InGaAsP confinement layers of higher compositional refractive index. Active region 15 may also be a multiple quantum well region, for example, comprising well layers of GaInP and barrier layers AlGaInP or alternating layers of AlGaInP of different Al compositional ratio, as is known in the art. Use of two or more quantum wells in such a structure provides for lower $T_0$, as is known in the art. Also, active region 15 is lattice matched to the GaAs substrate 11 but may be compressively or tensile strained to provide for slight lattice mismatch to improve device performance characteristics, as is known in the art.

Next, a p-AlGaInP upper confinement layer 16 is grown followed by p-AlInP upper/inner cladding layer 17, a p-GaInP stop etch layer 18, p-AlInP upper/outer cladding layer 19. Next, a group of transitional layers 20, 21 are formed which are index graded by means of monotonically changing the Al/Ga compositional ratio in the growth of these layers. Layer 20 comprises p-AlGaInP and layer 21 comprises AlGaAs. Lastly, a P⁺-GaAs cap layer 22 is formed to complete the device prior to pumping stripe formation and metalization.

Figure 4:
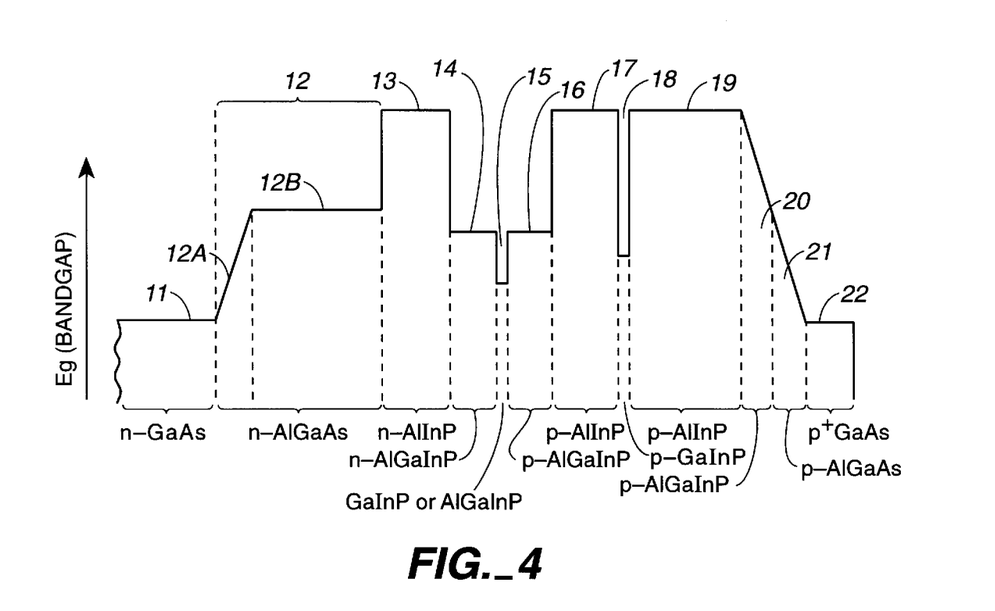
FIG. 4 is a bandgap diagram for the multiple layers of the device shown in FIG. 1.

While only one transitional layer 12 is shown in FIG. 4, it should be understood that two transitional layers respectively comprising n-AlGaAs and n-AlGaInP, such as similar to combination layers 21 and 20, could be utilized between n-AlGaAs layer portion 12B and lower cladding layer 13. The purpose of AlGaAs layer portion 12B is to function as a gettering agent for contaminates, such as $O_2$ and C, in the MOCVD reactor chamber. Group III-V, AlGaInP compounds are highly sensitive to these and other contaminants. The compound, AlGaAs, is a getter of these contaminants. The extended period of growth of AlGaAs layer 12 represented by portion 12B provides a means for cleaning up the MOCVD reactor of these contaminants prior to deposition of the AlGaInP-containing compounds, particularly those containing compositional Al, so that, upon the growth of the AlGaInP-containing cladding, confinement and active layers, good growth properties are achieved.

Transitional layers 12, 20 and 21 provide a means for decreasing the forward voltage drop in these layers while permitting the maintenance of good carrier confinement to active region 15 via cladding layers 13 and 17. The bandgap difference between GaAs substrate 11 and AlInP cladding layer 13 provides for a substantial band offset representing a significant barrier to carriers. As a result, a higher barrier is formed and the supply of carriers to active region 15 is impeded. This is of particular significance in the case of device 10 here where the ratio of areas in pumping region 28 to pumping stripe 26 is large. For a given forward voltage, only so much current density will be established through stripe 26, which may be only about 3 μm to about 5 μm wide. Since only a portion of the light is reflected back into single mode section as represented by stripe 26, it is important to achieve high carrier density in this section so that a larger optical gain can be sustained in active region 15 providing for a higher power output device.

Layers 12, 20 and 21 have compositional intermediate bandgaps between GaAs and AlInP which have wide bandgap offset between them. With a stepped increase in bandgap from GaAs to AlGaAs to AlGaInP to AlInP, these two widely different bandgap materials can be "bandgap matched" through index graded layers of AlGaAs or AlGaAs and AlGaInP by Al compositional ratio changes to provide a monotonically distributed bandgap profile between them as illustrated in FIG. 4. As a result, the significant band offset between GaAs and AlInP is eliminated.

In summary, graded layers 12, 20 and 21 reduce the impediment for carriers to transfer into active region 15 and, in the case of layer 12, the growth of a thick AlGaAs layer at high temperatures, i.e., above around 800° C., cleans the reactor system in which the growth is being carried out of contaminants so that upon initiation of the growth of AlGaInP-containing materials, high quality growth can be accomplished with a reduction in band offset between the AlGaInP-containing materials and GaAs by employing an index graded layer 12A for providing a region stepped refractive indices and, therefore, reducing the resistance to the passage of carriers through these layers. This combination provides for better conversion efficiency over GaInP/AlGaInP/GaAs structures of the prior art.

As shown in FIG. 2, single mode section 10A, is etched back through cap layer 22, transitional layers 20, 21 and upper/outer cladding layer 19 to stop layer 18 using etchants that are highly effective for removal of AlInP but not for removal of GaInP, as is known in the art. Prior to performing the etching operation, a portion of cap layer 22 is masked to define stripe region 26. After performing the etching operation, a regrowth is performed comprising multiple layers 22A of GaAs forming a n-p-n region to function as a current blocking region as well as function as a loss-guide for lightwave propagation of light in active region 15 propagating beneath formed stripe 26. Layers 40, 41 and 42 may each be, for example, about 0.3 μm thick and n-GaAs layers 40 and 42 may be doped with Si or Se, between which is p-GaAs layer 41 doped with Zn or C. The p-dopant preferred is C because of its comparatively better stability from readily diffusing or moving into adjacent layers.

It should be realized that single mode section 10A may be operated as a self-pulsing diode laser, stable resonator device 10 which self-pulsates under a dc bias emitting a high frequency stream of optical pulses by including a saturable absorbing structure which can be quickly emptied by diffusion of carriers to facilitate the self-pulsation function. To significantly reduce the feedback sensitivity of the device, it is useful to modulate the laser at high speeds, such as several hundred MHz. This high frequency modulation of the device destroys the coherence of the output and renders the laser device insensitive to feedback and, therefore, low noise under a wide range of operating conditions. Unfortunately, incorporating a circuit to bias and modulate the laser device at high frequency considerably complicates the final system and adds additional expense. If the laser device is inherently self-pulsating when driven by a dc bias, an optimum operation can be achieved, however. This is accomplished by positioning a high refractive index, light absorbing layer outside active region 15 but sufficiently close to active region 15 so that it overlaps the light propagating mode. Such a layer is comprised of a quantum well with an emission wavelength longer than the lasing wavelength of device 10. This absorbing layer may, for example, be positioned between the confinement and cladding layers 16, 17, comprising p-GaInP having a comparable refractive index as active region 15. Alternatively p-GaInP layer 18 may be sufficient close to active region 15 to function, as shown in FIG. 2, as a light absorbing layer having a comparable refractive index as active region 15. Also, such a light absorbing layer can be on the n-side of device 10 between layers 13, 14 or both comparably positioned absorbing layers can be positioned on both sides of active region 15. In any case, operation as a light absorbing layer 18 is as follows.

When device 10 is energized, the light absorbing layer has a high absorption coefficient and begins to absorb light generated in active region 15. However, as carriers collect in the absorbing layer, the absorption coefficient drops resulting in reduced loss in the laser cavity allowing the onset of a strong lasing mode in the device. As a result, carriers are depleted in the active region below the threshold level of device 10 due to the intense lasing mode and laser device 10 terminates lasing mode operation. Once terminated, carriers diffuse along the absorbing layer and fall into regions of low bandgap energy, such as GaAs region 22A. Although the carriers generated in the light absorbing layer are confined above and below by higher bandgap cladding layer 17, the carriers are free to laterally diffuse to the side of the ridge region 26, shown in FIG. 2. Once the carriers so diffuse, they fall from the absorbing layer into lower bandgap regrown region 22A.

Optoelectronic device 10 may be operated as a stable resonator by the inclusion in single mode section 10A optical feedback gratings forming a master oscillator such as described in the previously incorporated patents. Such feedback gratings may be of distributed feedback (DFB) or of distributed Bragg reflector (DBR) configuration. As known in the art, these feedback gratings are difficult to fabricate in a device of the type shown in FIG. 1 having an integrated diverging gain section 10B. Therefore, device 10 is a good candidate for operating as an unstable or a marginally stable resonator (i.e., an unguided waveguide) so that a more uniform lateral beam profile is obtained as is shown at 37E in FIG. 5, although the beam still possesses some quasi-Gaussian contour. Facets 10C and 10D are at least partially reflective, as known in the art, for forming a resonator cavity and a portion of the propagating light is internally reflected in the device cavity. Facet 10C may be a high reflecting surface and facet 10D may be partially reflective, such as reflecting about 5% of the light output. Diverging light reflected from facet 10D is absorbed in regions 30 of section 10B with a very small amount returned, straightline, along the device optical cavity into single spatial filter 10A as explained and set forth in incorporated U.S. Pat. No. 5,537,432.

In diverging gain section 10B, a pattern of current pumping regions 27 and 28, defined by diverging edges 27A, is formed by rendering all of regions 30 of section 10B of high resistance. These higher resistance regions 30 are accomplished by means of a boron or carbon implant to a depth within upper/outer cladding layer 19, such as at about $3 \times 10^{15}$ cm$^{-2}$. The resistivity of the layered material in implanted regions 30 is rendered significantly higher forming current confinement and pumping regions 27 and 28. While GaAs regrowth could be a consideration in the regions, the implant is preferred because the composition of the underlying material is not changed and only a slight refractive index difference between pump regions 27, 28 and implanted regions 30 to provide for current confinement to these regions with sufficient lightwave guidance, particularly important for operation as an unstable resonator, without excessive absorption and deterioration of the propagating beam evanescent tail portions. Gain waveguiding in section 10B is defined by carrier density within pumping of region 28, which carrier density increases as the diverging region 28 increases so that the effective waveguiding refractive index difference, An, between regions 28 and 30 also increases as the current density increases. The implant is patterned in the initial portion (identified as region 34 in FIG. 5) of section 10B via selective masking to form the plurality of pumping stripes 27 to only partially pump the light beam as it exits from single mode section aperture 23.

It should be realized that the pattern of stripes 27 in FIG. 1 is representative of only one of many preferred embodiments for such pumping stripes, as many other configurations are realizable to meet the objectives of this invention, which includes reduced pumping at the narrow end of diverging gain section 10B to permit initial spread of the light beam fully into the boundaries of the gain section prior to intensive pumping to permit improved optical power enhancement of the beam edges. These other configurations are shown in FIGS. 10A to 10E. The patterns shown are for purposes of exemplification in that the number or area size of the stripes or pattern can be varied in any number of ways, such as, by increase in the number of pattern stripes or points by reducing their size and increasing their density, or rendering the pattern stripes or points all the same size or rendering them to have a monotonically increasing area size from aperture 23 into section 10B. Moreover, the patterns can be interspersed, such as, for example, the dot pattern shown in FIG. 10B may be placed at the narrow end of section 10B adjacent to aperture 23 followed by the stripe pattern with converging end tails shown in FIG. 10D. In another aspect, the pumping pattern is void at the outer reaches 27A of the diverging section, i.e., along diverging edges 27A of section 10B, the pumping pattern is not present to interfere with the beam spreading and filling function.

Figure 10A:
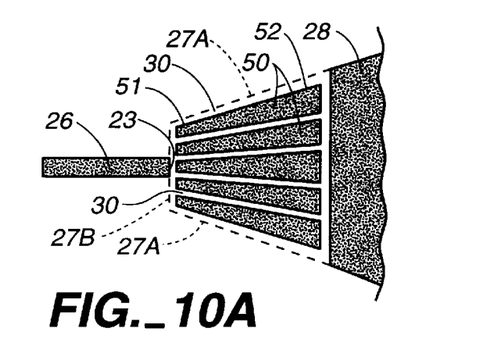
FIGS. 10A–10E schematically illustrate different embodiment for the diverging gain section patterned pumped region for the semiconductor optoelectronic device of this invention.
Figure 10B:
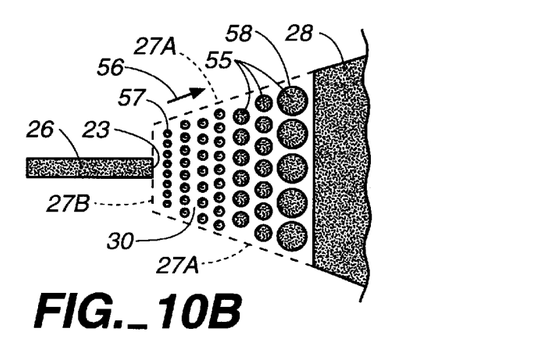
Figure 10C:
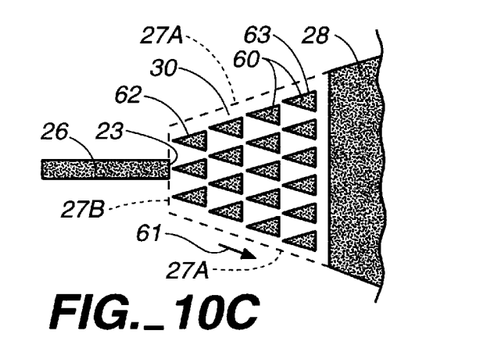

In FIG. 10A, pumping pattern 50 consists of elongated pumping stripes extending fairly in the direction of the propagating light and in the direction of the optical axis of device 10. Stripes 50 may of uniform width or of monotonically increasing width, as indicated by the different stripe width at 51 compared to 52, to monotonically increase pumping intensity of the propagating light as it progresses further into the narrow end of section 10B. Also, the most central stripes 53 may be of larger area or size to accommodate greater pumping of the higher power portion of propagating Gaussian-shaped light beam while the beam spreads and fill to edges or boundaries 27A of the diverging gain section. In FIG. 10B, a pattern of pumping dots 55 is formed which may be all of the same size or of progressively increasing size from aperture 23 forward into section 10B in the direction of arrow 56, as shown in FIG. 10B, from small size at 57 to a largest size at 58. In the case of a dot pattern of dots of the same size (not shown), preferably the density of the dots would be less at aperture 23 in the beginning of diverging section 10B and monotonically increase in their density in the direction arrow 56. The point pattern of FIG. 10B may be of any other kind of configuration, such as triangular shaped components 60 shown in FIG. 10C. Triangular shaped pattern regions or dots 60 may be all of the same size with monotonically increasing density or of monotonic increasing size in the direction of arrow 61 from a smallest size 62 to a largest size 63.

Figure 10D:
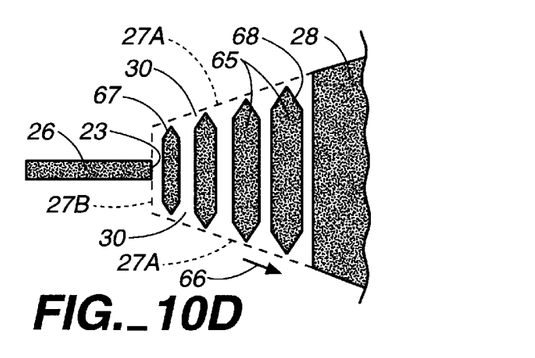
Figure 10E:
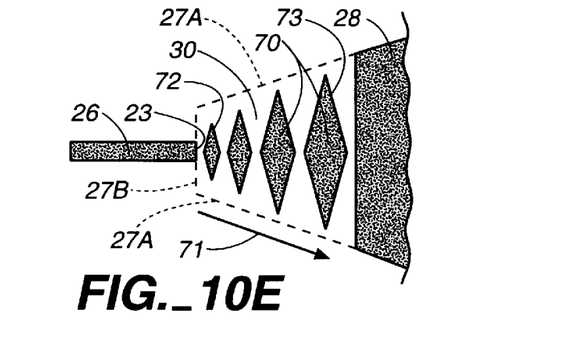

FIGS. 10D and 10E illustrate variations in the stripe pattern 27 of FIG. 1. The pattern strips 65, 70 are dimensionally largest in their central region where the propagating Gaussian-shaped light beam is the strongest in terms of optical power. These patterns permit initial comparatively stronger pumping of the beam while permitting the beam to spread and fill the diverging section to edges 27A where there are no pumping stripes present. The shape of the stripes 65, 70 may converge laterally at their opposite ends toward edges 27A in a manner or at a rate of similar to the Gaussian-shaped light beam pattern. In FIG. 10D, stripe pattern 65 comprises a plurality of transversely disposed stripes with converging ends terminating prior to reaching the diverging edges 27A. The pattern stripes 65 may be of the same width (not shown) with monotonically increasing length with either the same spacing or period or with monotonically decreasing interspacing to progressively increase their density. As shown in FIG. 10D, stripes 65 are of monotonically increasing size in the direction of arrow 66 progressing from stripe 67 to stripe 68 with substantially the same spacing. Pattern 70 in FIG. 10E is similar to pattern 65 of FIG. 10D except that the stripes are of more diamond shaped pattern with the widest portion of the pattern stripes central of the strongest portion of the optical power of the propagating Gaussian-shaped light beam. Stripes 70 may be of monotonically increasing dimension in the direction of arrow 71 progressing from stripe 71 to stripe 73.

Figure 5:
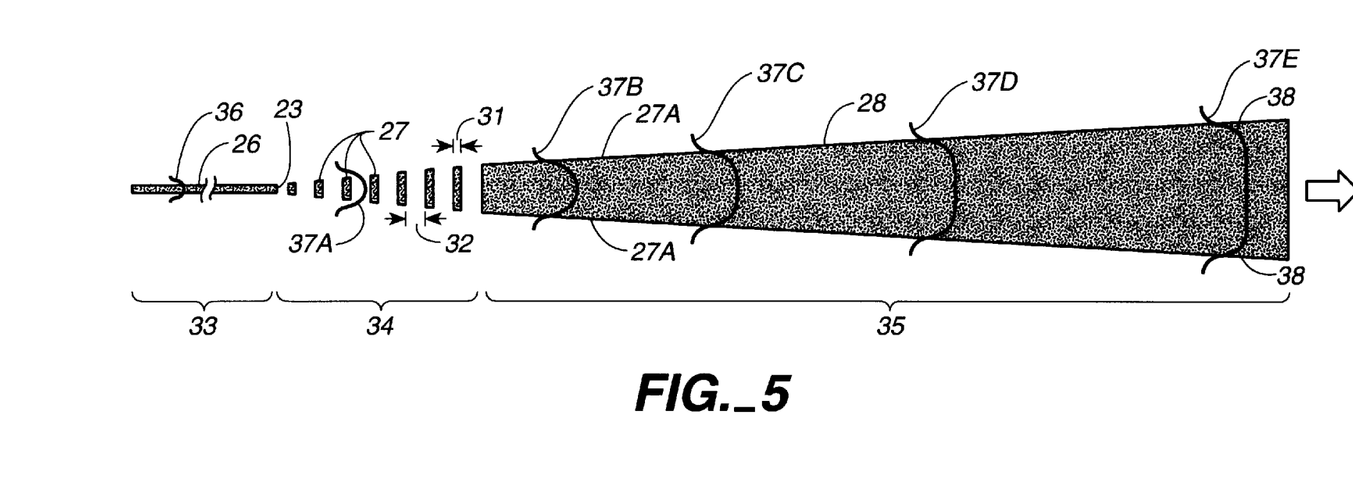
FIG. 5 is a plan view of the pumping stripe pattern which is drawn fairly to scale for purposes of explaining the invention.

FIG. 5 is shows pump stripe pattern 26, 27, 28 for device 10 drawn fairly to scale (with a portion of single mode strip 26 omitted due to length). The relationship of the lengths of pump sections 33, 34 and 35 are important for obtaining an optimized device operation. A longer pattern and cavity length improves the diffraction limited power of the resultant beam but threshold efficiency will be degraded so that some efficiency is compromised in order to achieve improved beam quality. The relationship between the length of single mode stripe 26 and the length of diverging gain region 10B comprising contact regions 27 and 28 is one of design from the standpoint of current density distribution. In a typical device, single mode section 10A may be about 40% of the cavity length while beam diverging gain section 10B may be about 60% of the cavity length. The patterned stripe section 34 may be about 5% to about 20% of the entire length of section 10B, e.g. about one-tenth of the size of section 10B. The formed stripes 27 in section 34 may be of equal spacing period or may have a period greater than the width of individual pumping stripes 27, e.g., their period 32 may about 25 μm and the stripe width 31 may be about 5 μm wide. However, there is no need for fixed relationship of this pattern as long as input section 34 is subjected to reduced pumping activity to accomplish the purpose of this invention. The stripe pattern section tailors the current so that the light beam 37A emerging from aperture 23 will have an initial opportunity to diverge laterally into the narrow end expanse of diverging gain section 10B prior to intense current pumping that takes place in pumping region 28. By permitting the beam to initially expand before aggressive gain pumping, the beam is permitted to fill and establish its divergence property insuring improved gain saturation of the propagating beam edges when it enters into pumping region 28. The effect of edge gain enhancement is illustrated in FIG. 5 by transverse mode waveforms 37. The beam transverse mode profile 36 in single mode section is, of course, quite small. As the light beam emerges at 37A from aperture 23, the beam is not strongly pumped in section 34 to provide an opportunity to expand, as explained above. In section 35, the entire lateral width of the beam is continually subjected to gain pumping as it continues to diverge toward the output. The beam having already filled and established the divergence pattern across the diverging gain section 10B, improved saturation can be achieved along the entire beam lateral phase front. As indicated by the progressively expanding beam profiles 37B–37E, the beam becomes more of a flattened and broadened Gaussian beam profile with resultant higher saturation of propagating light edge portions 38, as illustrated at profile 37E, rendering a more laterally uniform beam profile. With the use of a carbon or boron implant to form high resistance regions 30, only a small refractive index change occurs along diverging edges 27A providing weak index guiding permitting the propagating light evanescent tails 38 to be more uniformly enhanced as the light beam spreads into diverging gain section 10B.

It should be noted that sections 34 and 35 may be pumped from a single source or may be differentially pumped with different current values or pumped at modulated pumping rates as taught in the incorporated patents, in particular, incorporated U.S. Pat. No. 5,539,571. Also, as taught by the several incorporated patents, sections 10A and 10B may be independently pumped to provide for fine tuning of the power of the beam output.

Figure 6:
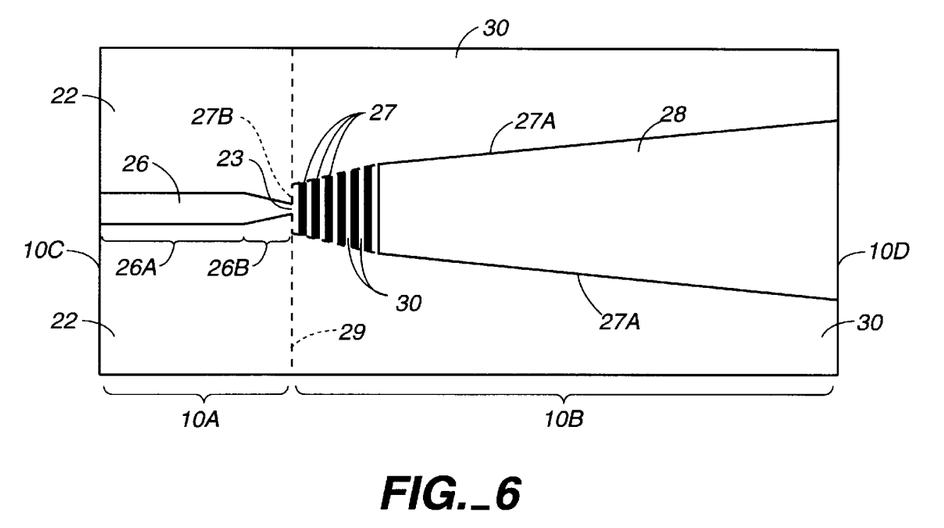
FIG. 6 is plan view of the device shown in FIG. 1 illustrating the pumping stripe and loss-guide configuration for the device.
Figure 8:
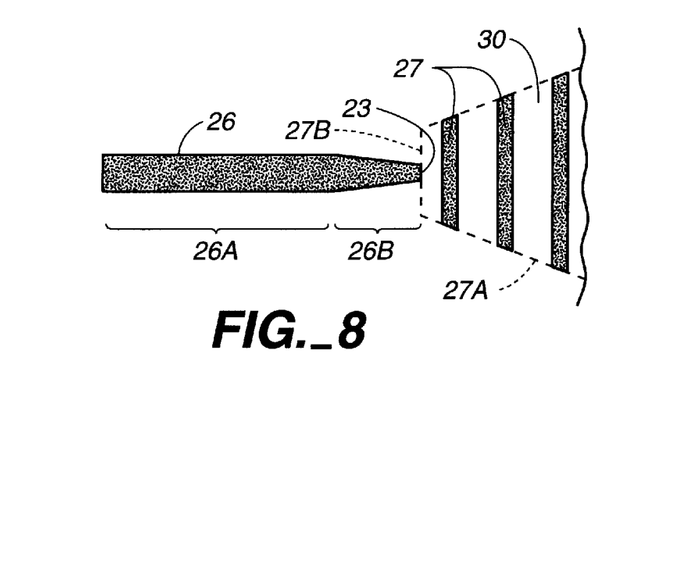
FIG. 8 is a detailed plan view of a portion of the pumping stripe configuration shown in FIG. 5.

Reference is now made to FIGS. 6 and 8 which show a detailed plan view of the pumping stripe regions of device 10. The purpose of FIGS. 6 and 8 is to illustrate a particular preferred pattern for single mode stripe 26. FIG. 8 is a more detailed view of a portion of stripe 26 for purposes of later comparison with FIG. 9. Stripe 26 may have two portions, a uniform width portion 26A, e.g., about 4 μm, and a tapered portion 26B which tapers or narrows in width to aperture 23, e.g. 2 μm. Uniform width portion 26A of single mode section 10A permits a portion of this section to be of wider extent to provide for more current flow and higher current density with corresponding higher carrier conversion efficiency utilizing the affect of transitional layers 12, 20 and 21, as previously discussed. Tapered portion 26B contributes to establishing the desired beam divergence via aperture 23 into the diverging gain section 10B where the size of aperture 23 is roughly proportional to the FWHM of the propagating light beam. The beam divergence rate is established by the size of aperture 23, i.e., the smaller the aperture 23, the larger the beam divergence into diverging gain section 10B. Diverging beam section 10B beginning at aperture 23, laterally opens immediately into an area starting at section end 27B that is wider than aperture 23 to permit the propagating light to immediately expand, spread and fill into the region of patterned current pumping stripes 27 along diverging edges 27A. The current pumping pattern of stripes Z7 in section 34, as previously explained, provides an opportunity for the propagating beam to expand at the desired angle of divergence prior to saturated gain pumping to significantly increase the optical power of the output beam.

Figure 7:
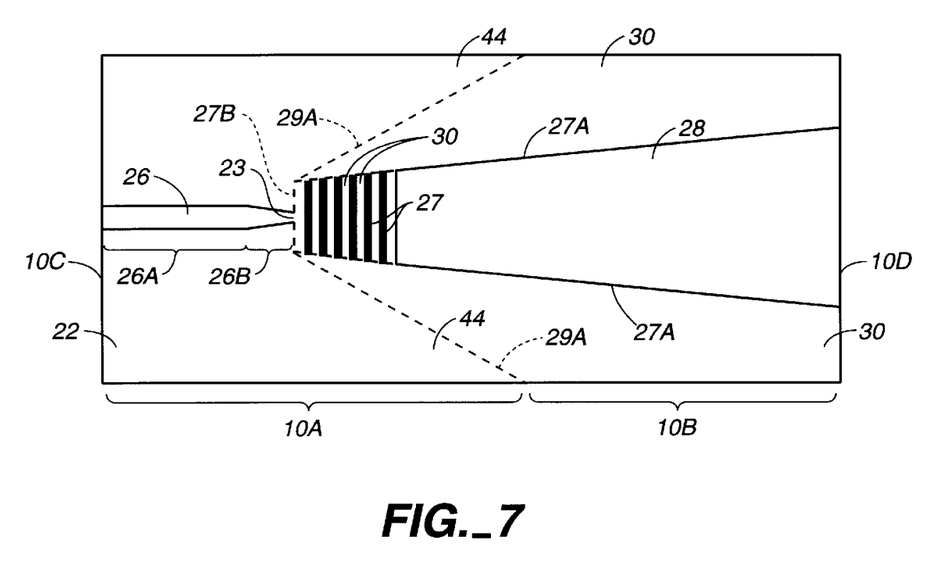
FIG. 7 is a plan view of the device shown in FIG. 1 illustrating a modification to the configuration shown in FIG. 6.

FIG. 7 is the same as FIG. 6 except that the current confinement region formed with n-p-n blocking layer 22A is extended from line 29, shown in both FIGS. 1 and 6, to a position within diverging gain section 10B at lines 29A forming wing-like lightwave absorber regions 44. Lightwave absorbing regions 44 in areas outside of semiconductor gain region 28 absorb light reflected back into the optical cavity length from facet 10D and diverted at an angle other than normal to the optical axis of device 10. Therefore, only a small portion of reflected light from facet 10D enters as feedback through aperture 23 into single mode section 10A.

Figure 9:
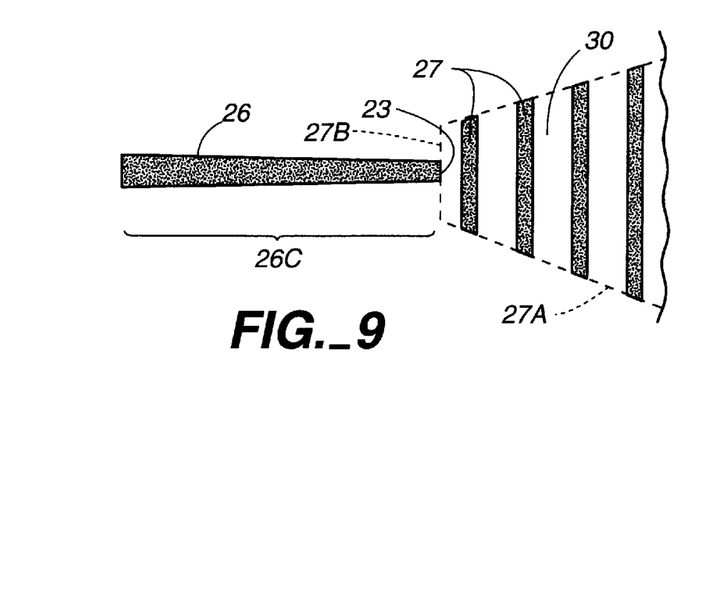
FIG. 9 is a detailed plan view similar to FIG. 8 but illustrating a modification to the configuration shown therein.

FIG. 9 illustrates an alternative embodiment to the tapered stripe section 10A of FIG. 6. In FIG. 8, the tapered portion 26B may be a small portion of the length of section 10A, e.g., about one-tenth of the length of section 10A. This provides for a sufficiently wide stripe for pumping purposes before attendance to the divergence angle requirements of the propagating beam established by aperture 23. Alternatively, tapered portion 26B may extend along more of the length of single mode section 10A, if desired, and extended to end facet 10C as illustrated by tapered section 26C in FIG. 9.

The visible wavelength, optoelectronic device 10 provides a GaInP/AlGaInP/GaAs material system that can deliver a room temperature, high CW power, diffraction limited, single transverse mode beam. As an example, device 10, illustrated in FIG. 1, may provide a 500 mW single mode beam with a 1.5 mm FW $1/e^2$ beam diameter and having a wavelength of about 680 nm, ±10 nm, with a 5 nm spectral bandwidth enabling efficient energy coupling into solid state host mediums, print media or employed as a highly visible display beam. The threshold operating current is about 0.75 A with an operating current of about 2.3 A and device series resistance of about 0.2 Ω. Device 10 may be mounted on a diamond submount with a TEC cooler.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications as that are within the spirit and scope of the following claims.

What is claimed is:

1. A semiconductor laser having a visible red spectrum output comprising:

a broadened gain section forming at least one portion of said laser;

a narrow single mode section forming at least one other portion of said laser and optically coupled at one end to a narrow end of said broadened gain section;

the ratio of the pumped areas of the broadened gain section compared to the narrow single mode section being large so that the broadened gain section acts as a high gain region and the narrow single mode section has a given limited carrier density;

the broadened gain section and narrow single mode section forming, at least in part, an optical cavity for propagation of light wherein the light expands into said broadened gain section through the broadened gain section narrow end from said single mode section to a reflector at an other end of said broadened gain section;

a small portion of ligh being reflected back from said other end reflector into the narrow single mode section due to its narrow width;

at least said single narrow single mode section including a semiconductor substrate and a semiconductor cap layer between which is formed a plurality of a semiconductor confinement layers amd a semiconductor active region for said laser, the bandgap differences between said substrate and said cap layer and said cladding layers comprising a large band offset providing a barrier to the flow of carriers to the active region;

the improvement comprising:

refractive index graded layers formed between either said substrate or said cap layer and said cladding layers or both in said narrow single mode section, said index graded layers having monotonically distributed bandgap profile to improve carrier flow to achieve higher carrier density than said given carrier density in said narrow single mode section section and , correspondingly, the higher levels of optical gain achieved in the broadened gain section increasing the overall power output capability from the laser.

2. A semiconductor laser of claim 1 wherein said narrow single mode section and said broadened gain section are separate semiconductor chips.

3. The semiconductor laser of claim 1 wherein said narrow single mode section and said broadened gain section are integrated on a single semiconductor chip.

4. The semiconductor laser of claim 1 wherein said index graded layers comprise AlGaAs, AlGaInP, or a combination of AlGaAs and AlGaInP.

5. The semiconductor laser of claim 1 wherein said broadened gain section is a flared amplifier.

6. The semiconductor laser of claim 1 wherein the laser is operated as an unstable resonator or as a stwable resonator.

7. The semiconductor laser of claim 1 wherein regions along adjacent sides of the broadened gain section are of high resistance to provide for current confinement with sufficient lightwave guidance of light propagating in the broadened gain section.

8. The semiconductor optoelectronic device of claim 7 wherein said high resistance regions are formed by a boron or carbon implant.

9. The semiconductor laser of claim 1 wherein an index guided layer formed between said substrate and said cladding layers functions to getter contaminates from a growth environment during the growth of the laser to reduce contamination in the growth of said cladding layers and said active regions.

10. The semiconductor laser of claim 1 wherein said substrate and cap layer comprise GaAs, said claddign comprise AlGaInP and AlInP, and said active region comprises GaInP.

* * * * *